(12) United States Patent
Vogelsang

(10) Patent No.: US 12,327,049 B2
(45) Date of Patent: *Jun. 10, 2025

(54) STACKED MEMORY DEVICE WITH PAIRED CHANNELS

(71) Applicant: Rambus Inc., San Jose, CA (US)

(72) Inventor: Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/470,232

(22) Filed: Sep. 19, 2023

(65) Prior Publication Data

US 2024/0086112 A1    Mar. 14, 2024

Related U.S. Application Data

(63) Continuation of application No. 17/323,024, filed on May 18, 2021, now Pat. No. 11,775,213.

(60) Provisional application No. 63/030,628, filed on May 27, 2020.

(51) Int. Cl.
*G06F 3/06* (2006.01)

(52) U.S. Cl.
CPC ............ *G06F 3/0659* (2013.01); *G06F 3/061* (2013.01); *G06F 3/0673* (2013.01)

(58) Field of Classification Search
CPC ....... G06F 3/061; G06F 3/0659; G06F 3/0673
See application file for complete search history.

(56) References Cited

U.S. PATENT DOCUMENTS

| | | |
|---|---|---|
| 6,487,102 B1 | 11/2002 | Halbert et al. |
| 7,983,095 B2 | 7/2011 | Kim et al. |
| 8,243,487 B2 | 8/2012 | Kang et al. |
| 8,717,828 B2 | 5/2014 | Kim et al. |
| 9,087,614 B2 | 7/2015 | Son et al. |
| 9,117,496 B2 | 8/2015 | Shaeffer et al. |
| 9,778,877 B1 | 10/2017 | Ware |
| 9,824,036 B2 | 11/2017 | Perego et al. |
| 10,114,587 B2 | 10/2018 | Song et al. |
| 10,223,309 B2 | 3/2019 | Ware et al. |
| 10,235,242 B2 | 3/2019 | Wright et al. |
| 10,254,331 B2 | 4/2019 | Ware |
| 10,360,972 B2 | 7/2019 | Ware et al. |
| 2015/0046760 A1 | 2/2015 | Vogt |

(Continued)

OTHER PUBLICATIONS

Hybrid Memory Cube Consortium, "Hybrid Memory Cube with HMC-0G-VSR PHY, 4GB 4H DRAM Stack, 8GB 8H DRAM Stack", 2014, 132 Pages.

(Continued)

*Primary Examiner* — Yong J Choe
(74) *Attorney, Agent, or Firm* — Silicon Edge Law Group LLP; Arthur J. Behiel

(57) ABSTRACT

A stacked memory device includes memory dies over a base die. The base die includes separate memory channels to the different dies and external channels that allow an external processor access to the memory channels. The base die allows the external processor to access multiple memory channels using more than one external channel. The base die also allows the external processor to communicate through the memory device via the external channels, bypassing the memory channels internal to the device. This bypass functionality allows the external processor to connect to additional stacked memory devices.

20 Claims, 14 Drawing Sheets

(56) References Cited

U.S. PATENT DOCUMENTS

2017/0337144 A1 11/2017 Ware et al.
2018/0137067 A1 5/2018 Ware et al.
2018/0267911 A1 9/2018 Ware et al.
2021/0165596 A1 6/2021 Lee et al.

OTHER PUBLICATIONS

Jedec Solid State Technology Association, "High Bandwidth Memory (HBM) DRAM", JESD235A, Nov. 2015, 172 pages.
Jedec Solid State Technology Association, "High Bandwidth Memory DRAM (HBM1, HBM2)", JESD235B, Nov. 2018, 207 pages.

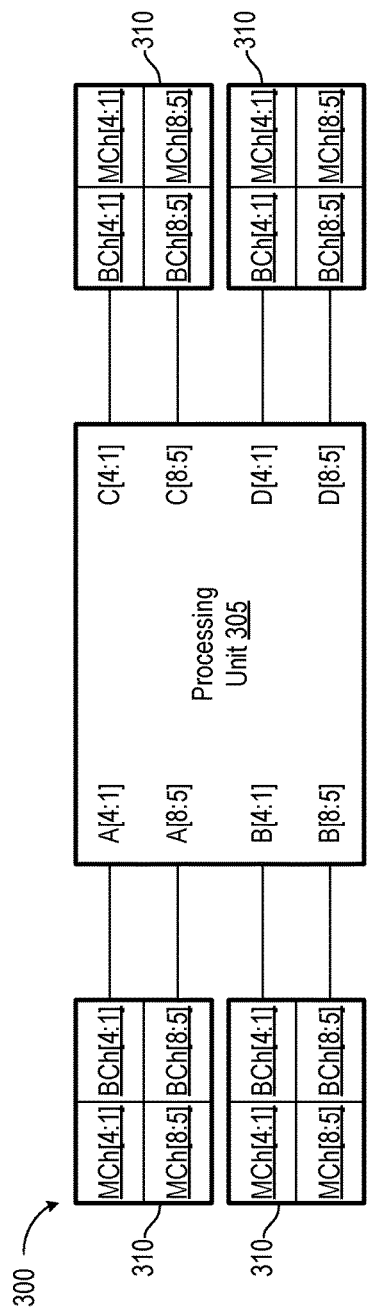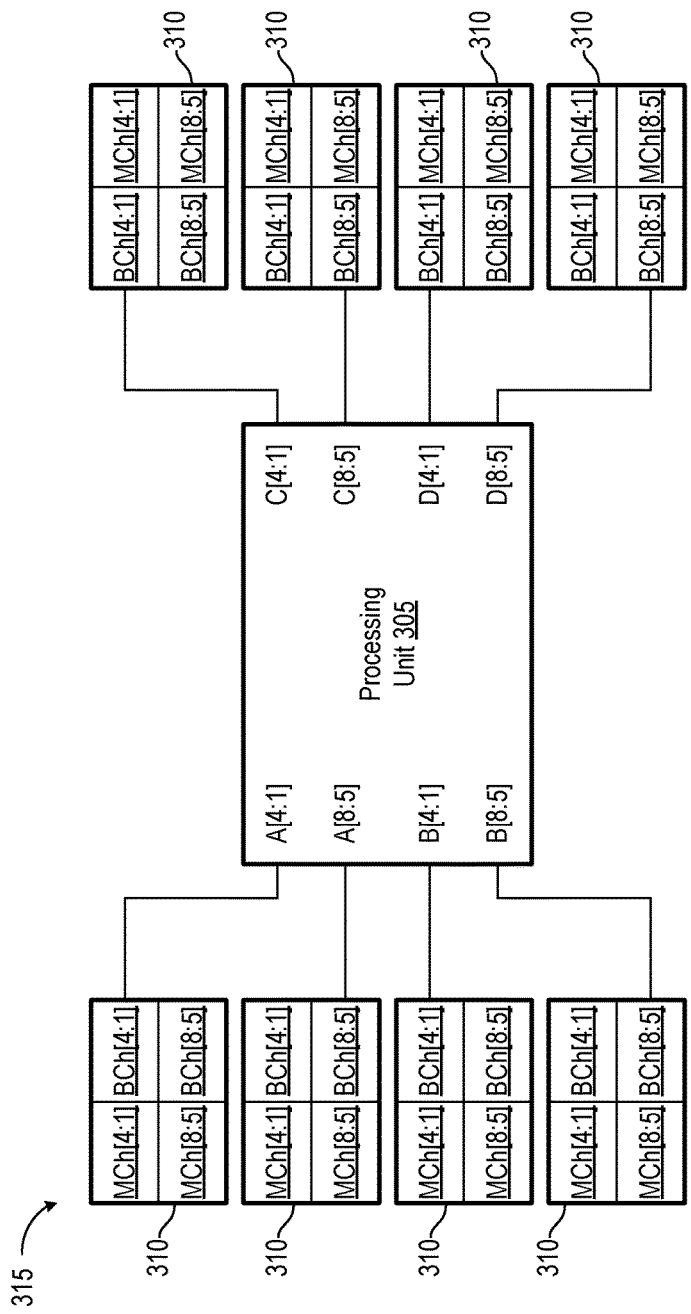

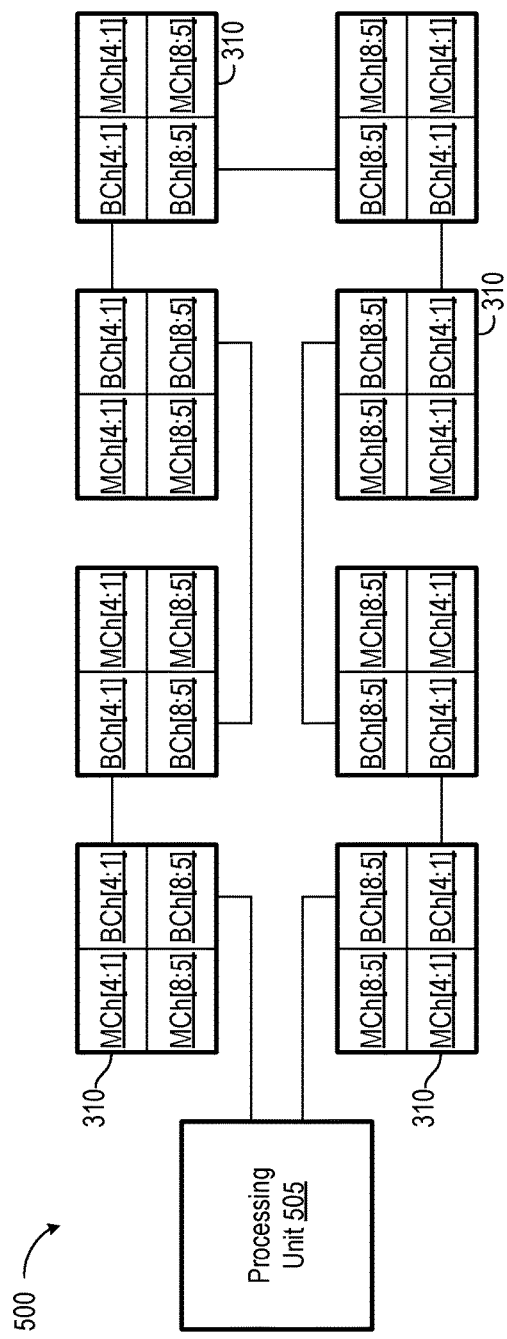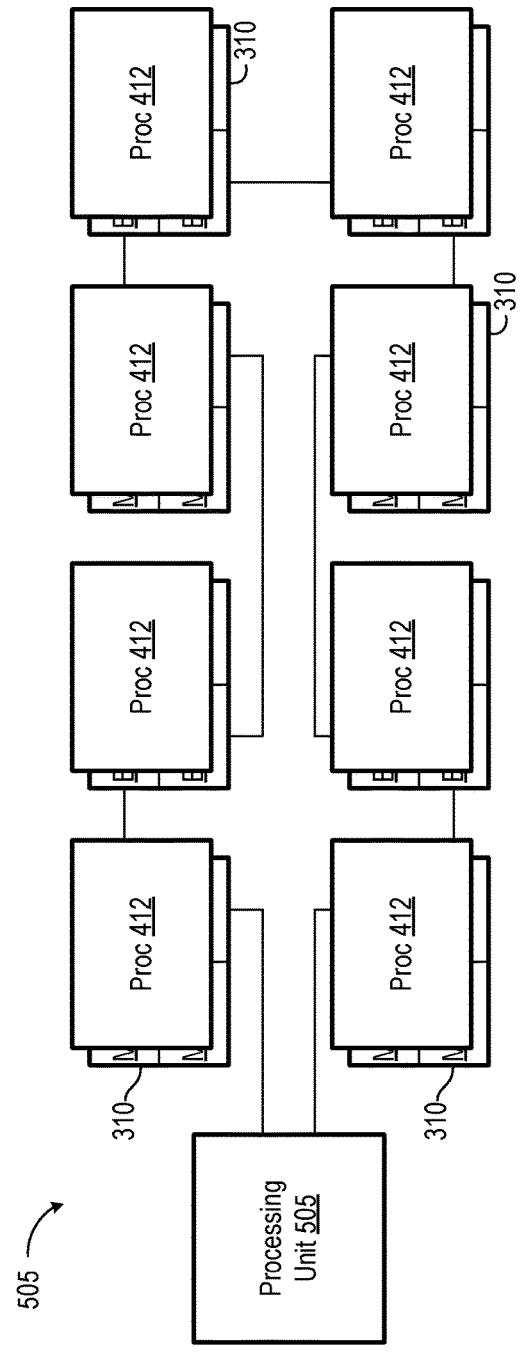

STACKED MEMORY DEVICE WITH PAIRED CHANNELS

BACKGROUND

An integrated circuit (IC) is a set of electronic circuits formed on and within the surface of a piece of a semiconductor wafer called a "die" or "chip." Memory chips and processors are common ICs. These and other types of ICs are ubiquitous. A three-dimensional IC (3D-IC) is a stack of ICs communicatively coupled using vertical connections so that they behave as a single device. Vertical integration improves efficiency and speed performance, especially per unit of area, relative to two-dimensional counterparts.

Computing systems in general benefit from larger memories with the improved efficiency and performance of 3D-ICs. Artificial neural networks, a class of computing system of growing importance, can include millions of simple, interconnected processors that require fast and efficient access to large data sets. The number of processors and the sizes of the data sets are expected to grow exponentially, and with it the need for ever larger, faster, and more efficient memory.

BRIEF DESCRIPTION OF THE DRAWINGS

The present disclosure is illustrated by way of example, and not by way of limitation, in the figures of the accompanying drawings. For elements with numerical designations the first digit indicates the figure in which the element is introduced, and like references refer to similar elements within and between figures.

FIG. 3A depicts a memory system 300 in which a processing unit 305 with eight sets of memory interfaces is connected to four, two-channel stacked memory devices 310.

FIG. 3B depicts a memory system 315 like system 300 of FIG. 3A but extended to include four additional memory devices 310 for double the capacity without additional latency.

FIG. 5A depicts a memory system 500 in which eight memory devices 310 are interconnected with a processing unit 505 in a ring configuration supported by the connectivity detailed in connection with FIGS. 2A-2I.

FIG. 5B depicts a memory system 505 like that of FIG. 5A but in which each memory device 310 is fitted with a processor die 412.

DETAILED DESCRIPTION

Figure 1:
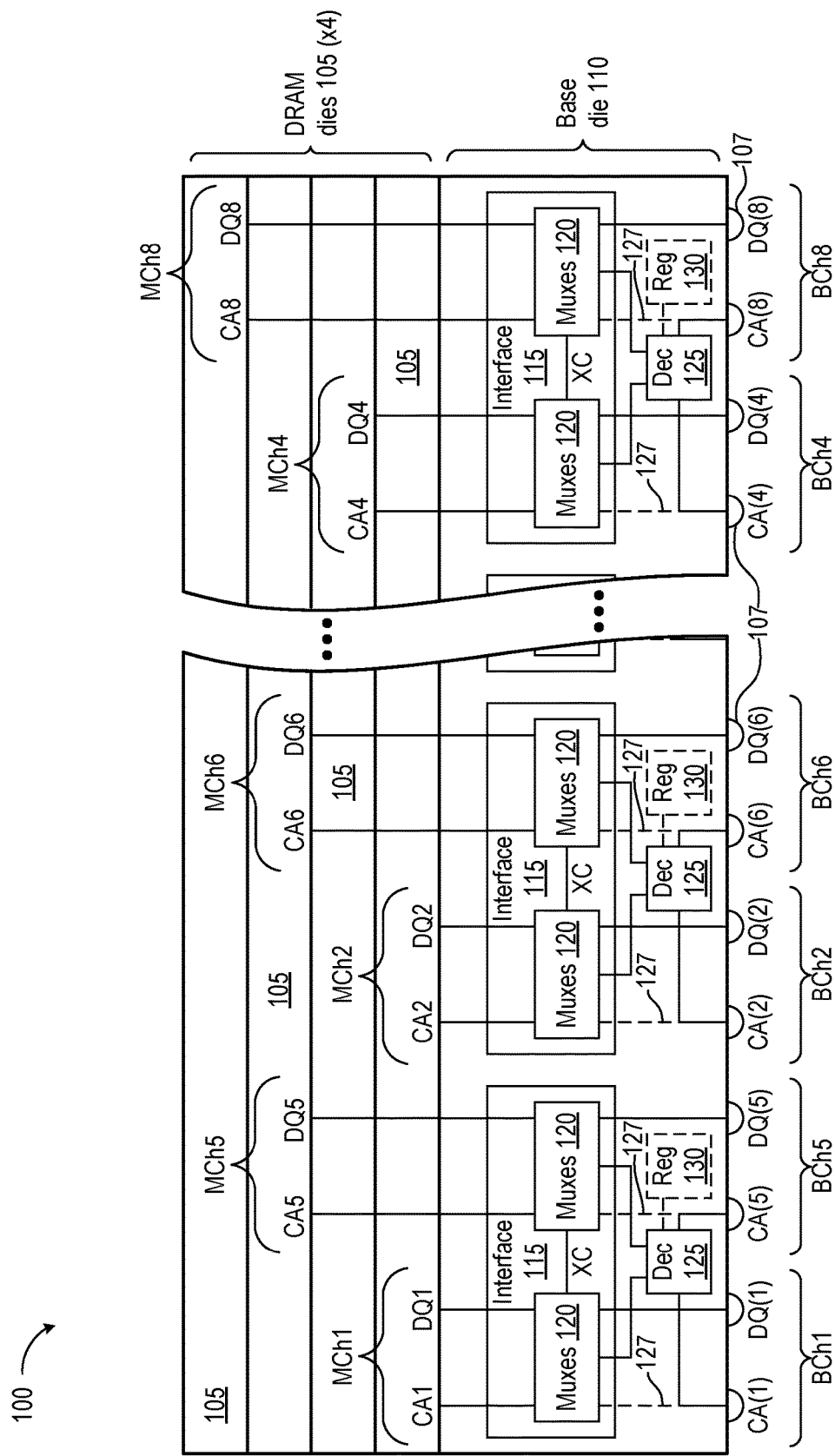
FIG. 1 depicts a stacked memory device 100, a 3D-IC with four memory dies 105 over a base die 110.

FIG. 1 depicts a stacked memory device 100, a 3D-IC with multiple memory dies 105 over a base die 110. Base die 110 buffers memory transactions between an external host (not shown) and memory dies 105. The external host can communicate with memory dies 110 on memory device 100 via eight external channels BCh[8:1] and eight corresponding internal channels MCh[8:1]. Alternatively, the external host can communicate with memory device 100 via four of external channels BCh[8:1] while retaining access to all eight internal channels MCh[8:1]. The external channels not connected directly to the external host can be connected to a downstream memory device, in which case the external host can communicate with the downstream memory device via base die 110. The flexible channel routing provided by base die 110 allows the memory capacity available to the host to be expanded without proportional reductions in efficiency or speed.

Command and data interfaces 115 facilitate access to addressable memory on memory dies 105, DRAM dies in this example, via external channels BCh[8:1] and internal, intra-stack channels MCh[8:1]. The leading "B" in the designations of external channels is for "bumps," an allusion to micro-bumps 107 that provide external connections to memory device 100; the leading "M" in the designations of internal channels MCh[8:1] (internal to device 100) is for "memory." Command and address signals can be communicated separately or can be relayed together in a packet format.

Interfaces 115 and their respective pairs of external and internal channels are essentially identical. With reference to the rightmost interface 115, base die 110 includes a pair of memory channels MCh[8,4], each including respective internal, intra-stack, command and data connections CA #/DQ # to a respective DRAM die 105. Interface 115 provides access to the addressable memory on either of the two dies 105 via either of external channels BCh[8,4]. This capability is supported by a switching fabric of multiplexers 120, under direction of a command decoder 125, and cross-channel connections XC that allow external command, address, and data signals on either of external channels BCh[8,4] to be communicated with either of internal channels MCh[8,4].

Pairing external channels using selectable cross-channel connections in base die 110 does not increase the number of micro-bumps 107 or vertical inter-stack connections (e.g., through-silicon vias or Cu—Cu connections) or reduce memory-access bandwidth. Each interface 115 also supports a bypass function in which external command, address, and data signals on one of the corresponding pair of external channels can be relayed via the other. Returning to the rightmost interface 115, for example, signals associated with external channel BCh4 can be relayed via channel BCh8, and vice versa, bypassing DRAM dies 105. As detailed below, this bypass connectivity allows compute resources (e.g., external processors) to connect to a large number of stacked memory devices 100 without unduly impacting power consumption or speed performance.

Command decoders 125, in the depicted embodiment, snoop command packets that arrive on their respective command/address nodes CA. Each packet includes state bits that determine the states of the corresponding multiplexers 120. Each command decoder 125 decodes the state bits while holding a given packet. After decoding the state bits switching muxes 120 accordingly, a command decoder 125 forwards the CA packet (stripped of the state bits) on the selected path through multiplexers 120. Read latency increases by the time required to decode a packet and switch muxes 120. DRAM dies 105 need not be modified.

In another embodiment, command decoders 125 snoop command packets in parallel as they are transmitted through multiplexers 120 on optional connections 127 shown using dashed lines. Also optional, mode registers 130 on base die 110 can be loaded responsive to mode-register packets and multiplexers 120 set according to the loaded mode value. Mode registers 130 can be initialized in a state that provides connectivity normally associated with the memory-die stack (e.g., muxes 120 are set to connect each of external channels BCh[8:1]) to a corresponding one of internal channels MCh [8:1]). This and other examples of selected connectivity are detailed below in connection with FIGS. 2A-I.

Because command decoders 125 examine packets in parallel, the command bits that load the mode register to determine the state of multiplexers 120 are not stripped from the command packet before being presented to the DRAM dies 105. These mode-register-set (MRS) bits are thus ignored by the DRAM die. Commands that do not impact the mode register are passed through base die 110 according to the current settings of multiplexers 120. In this embodiment, there is no additional delay for normal memory commands if muxes 120 are designed for pass through rather than for clocked forwarding. Setting multiplexers 120 takes longer than in the preceding embodiment because the memory-command sequence is stopped to send MRS commands. DRAM dies 105 need not be modified.

In yet another embodiment, command decoders 125 are omitted in favor of command decoders (not shown) that reside on DRAM dies 105 and are connected to the select inputs of multiplexers 120. DRAM dies generally include a command decoder for each channel. One such command decoder for each pair of internal channels can be modified to control the corresponding multiplexers 120. An advantage of this embodiment is that command decoders 125 can be omitted, though the need to modify command decoders integrated into available DRAM dies 105 may slow adoption.

Figure 2A:
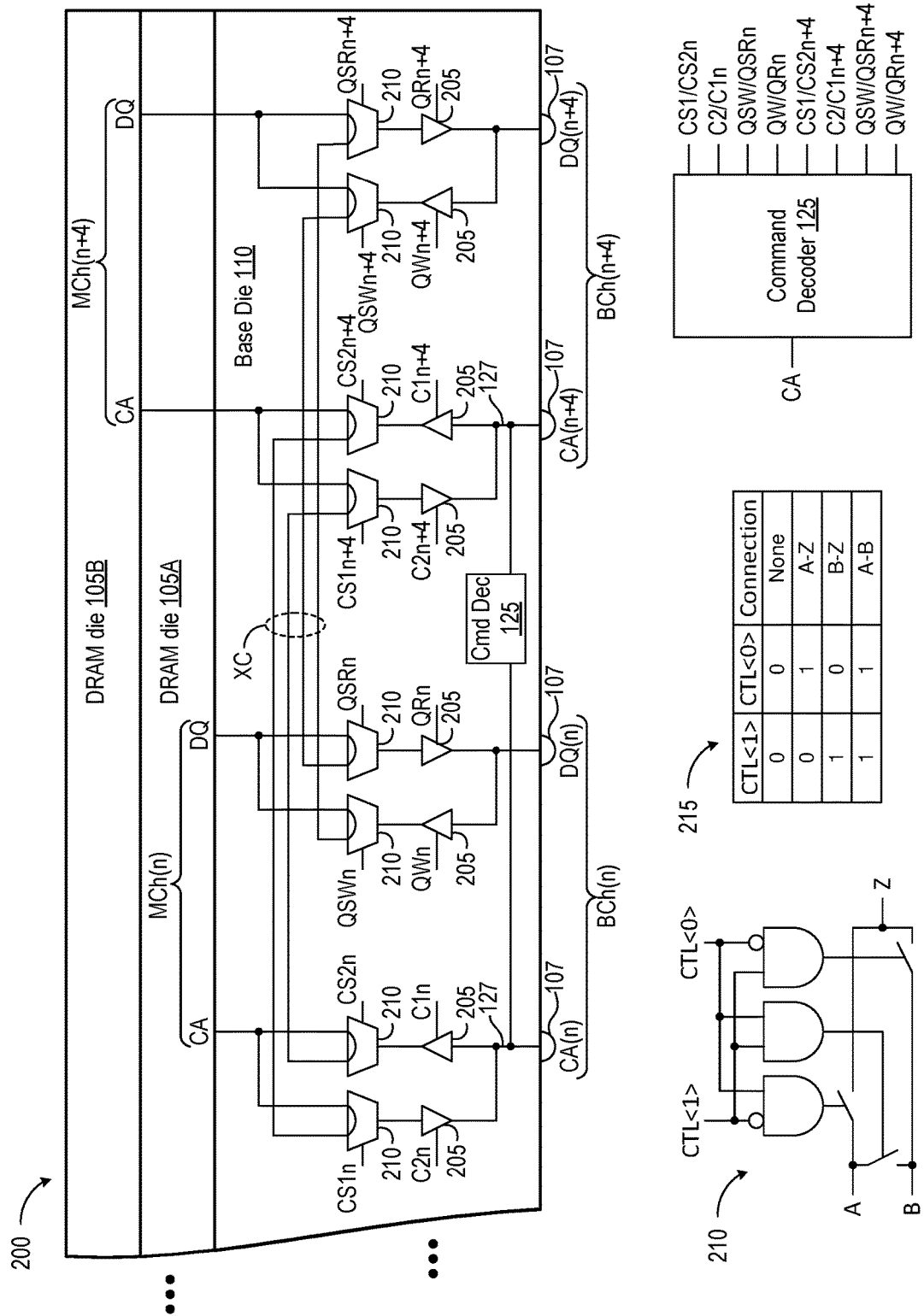
FIG. 2A details a stacked memory device 200 in accordance with another embodiment, with like-identified elements being the same or similar to those introduced in FIG. 1.

FIG. 2A details a stacked memory device 200 in accordance with another embodiment, with like-identified elements being the same or similar to those introduced in FIG. 1. In this example, command decoders 125 snoop command packets in parallel as they are transmitted through multiplexers 120 on connections 127. The depicted portion supports two external memory channels BCh(n) and BCh(n+4) and two internal channels MCh(n) and MCh(n+4), one to each of two DRAM dies 105A and 105B. The addressable memories represented by DRAM dies 105A and 105B include DRAM memory cells (not shown), which can be organized into e.g. addressable rows, columns, ranks, and banks. The addressable memories need not be DRAM and can be on the same memory die in other embodiments. Inter-stack and intra-stack command connections CA convey command and address signals using the same protocol in this example, but different protocols can be used by the different interfaces in other embodiments. The same is true for inter-stack and intra-stack data connections DQ.

Each external channel BCh is served by a corresponding set of buffers 205 and multiplexers 210. Depending on the settings of each multiplexer 210, external memory channel BCh(n) can communicate command/address signals CA(n) and data signals DQ(n) to the other external memory channel BCh(n+4), via cross-channel connections XC, or to either of DRAM dies 105A and 105B. External memory channel BCh(n+4) can likewise communicate command/address signals CA(n+4) and data signals DQ(n+4) with external memory channel BCh(n) or either of DRAM dies 105A and 105B. (In general, signals and their associated nodes carry the same designations. Whether a given moniker refers to a signal or a corresponding node will be clear in context.)

Each of buffers 205 has a control terminal that enables and disables the buffer depending upon the direction of signal flow. In the write direction, buffers 205 can be FIFO (first-in, first-out) buffers that hold and forward write data to maintain timing alignment between write command/address and data signals. Select signals C1$n$ and C1$n$+4 gate incoming command/address signals, select signals C2$n$ and C2$n$+4 gate outgoing command/address signals, select signals QWn and QWn+4 gate write data signals, and select signals QRn and QRn+4 gate read data signals.

Each of multiplexers 210 receives a two-bit control signal to support four connectivities between three input/output nodes. Select signals CS1/CS2$n$ and CS1/CS2$n$+4 control multiplexers 210 that direct command/address signals CA. Select signals QSW/QSRn direct write and read data, respectively, via external channel BCh(n). Select signals QSW/QSRn+4 direct write and read data, respectively, via external channel BCh(n+4).

An embodiment of multiplexer 210 is shown schematically at the lower left of FIG. 2A adjacent a corresponding truth table 215. Logic signals on control terminals CTL<1, 0> can be selectively asserted to (1) disconnect all nodes A, B, and Z; (2) interconnect nodes A and Z; (3) interconnect nodes B and Z; and (4) interconnect nodes A and B. Command decoder 125, shown at lower right, snoops incoming commands (command and address signals) and responsively asserts control signals to the collections of buffers 205 and multiplexers 210 to provide a requested connectivity for each command.

FIGS. 2B-2I use bold arrows to illustrate the connectivity and concomitant signal flow through stacked memory device 200 of FIG. 2A that can be selected by issuing commands that effect command decoder 125. Channels are illustrated as signal nodes for ease of illustration. In practice, the term "channel" refers to a collection of related components that act independently to communicate information between nodes or collections of nodes. A memory channel, for example, includes a physical layer that responsible for transmitting command, address, and data signals. Well-known physical layer elements are omitted for brevity.

Figure 2B:
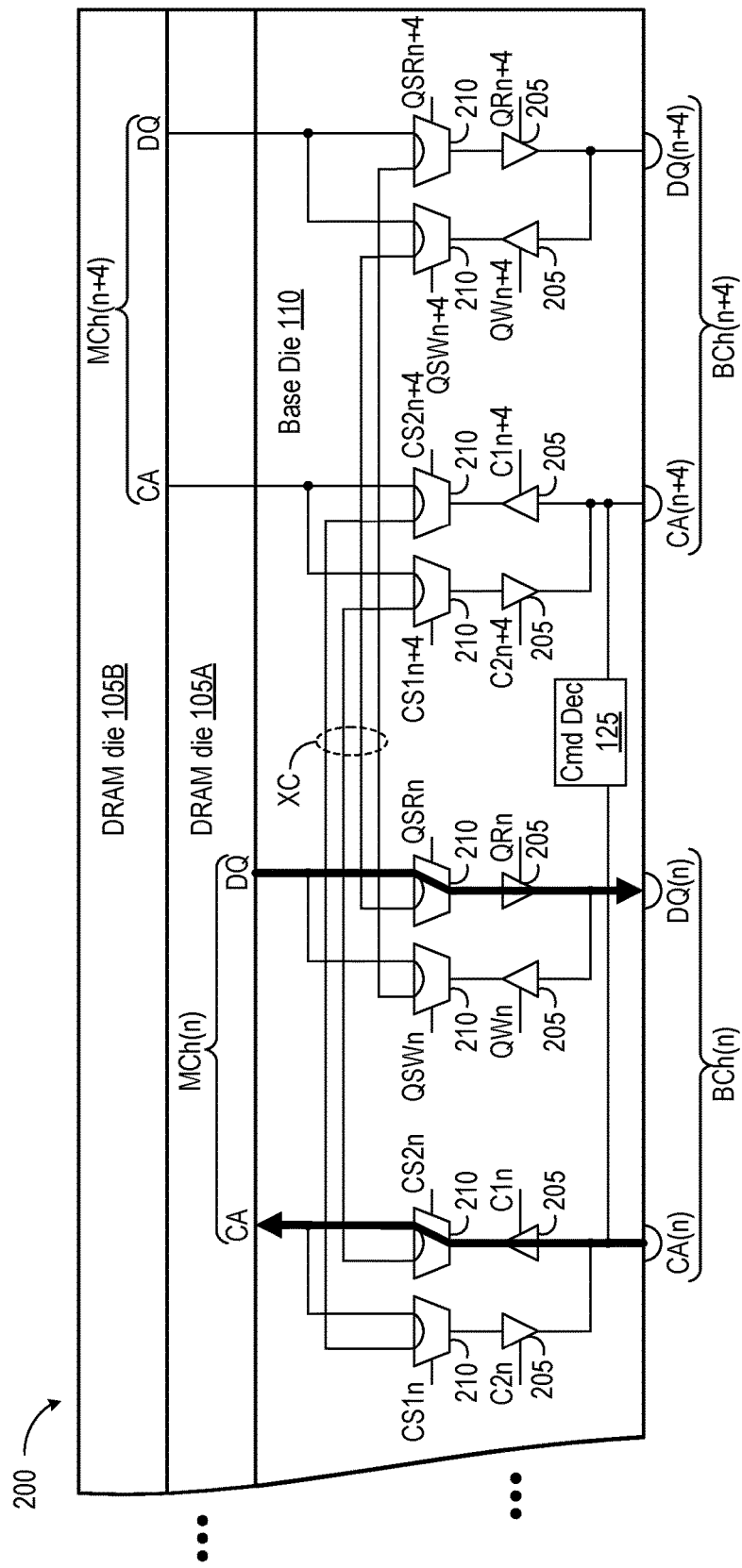
FIG. 2B depicts the signal paths of memory device 200 for command/address signals CA(n) and data signals DQ(n) on channel BCh(n) when asserting command signals CA to read data DQ from DRAM die 105A via memory channel MCh(n).
Figure 2C:
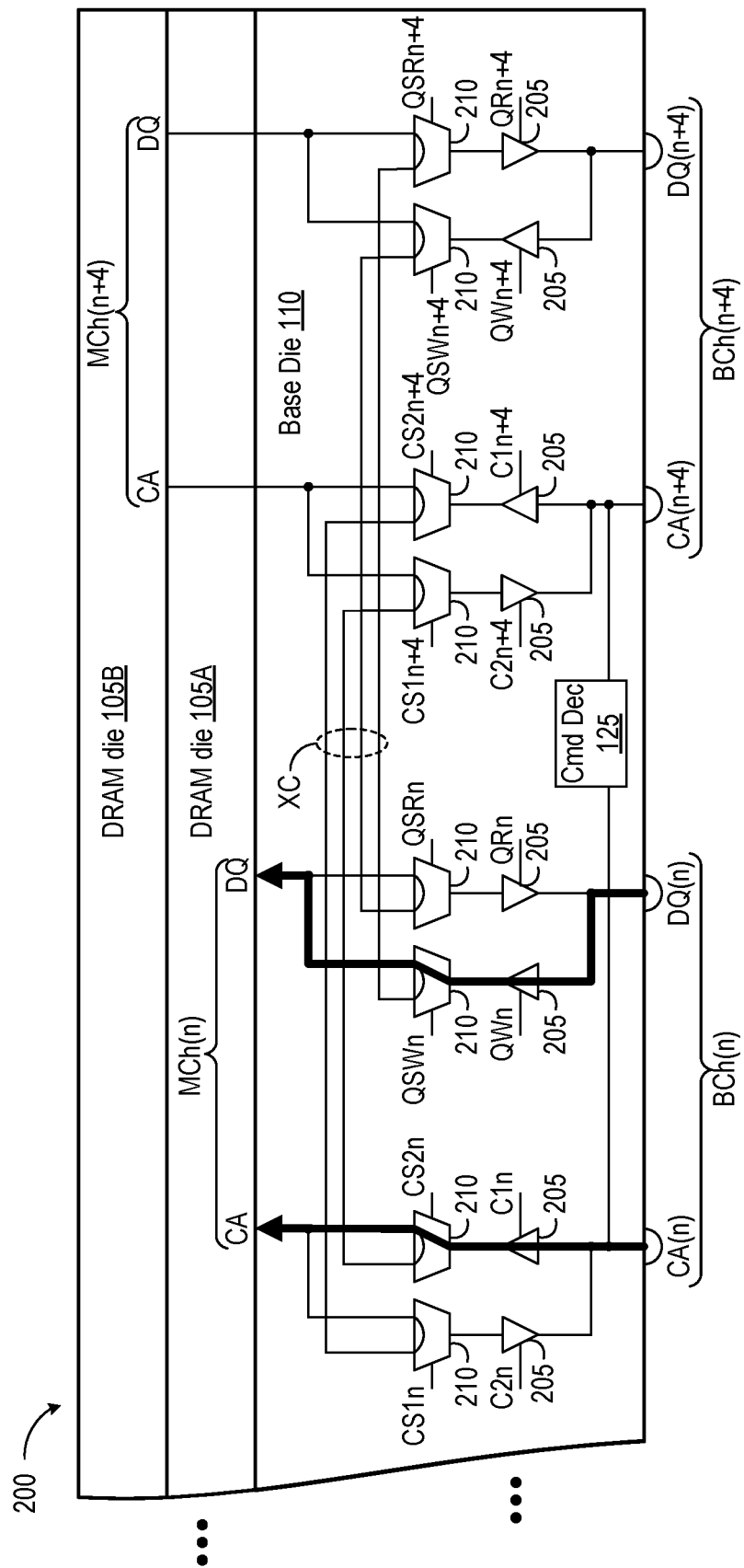
FIG. 2C depicts the signal paths of memory device 200 for command/address signals CA(n) and data signals DQ(n) on channel BCh(n) when asserting command signals CA to write data DQ to DRAM die 105A via memory channel MCh(n).

FIG. 2B depicts the signal paths of memory device 200 for command/address signals CA(n) and data signals DQ(n) on channel BCh(n) when asserting command signals CA to read data DQ from DRAM die 105A via memory channel MCh(n). FIG. 2C depicts the signal paths of memory device 200 for command/address signals CA(n) and data signals DQ(n) on channel BCh(n) when asserting command signals CA to write data DQ to DRAM die 105A via memory channel MCh(n).

Figure 2D:
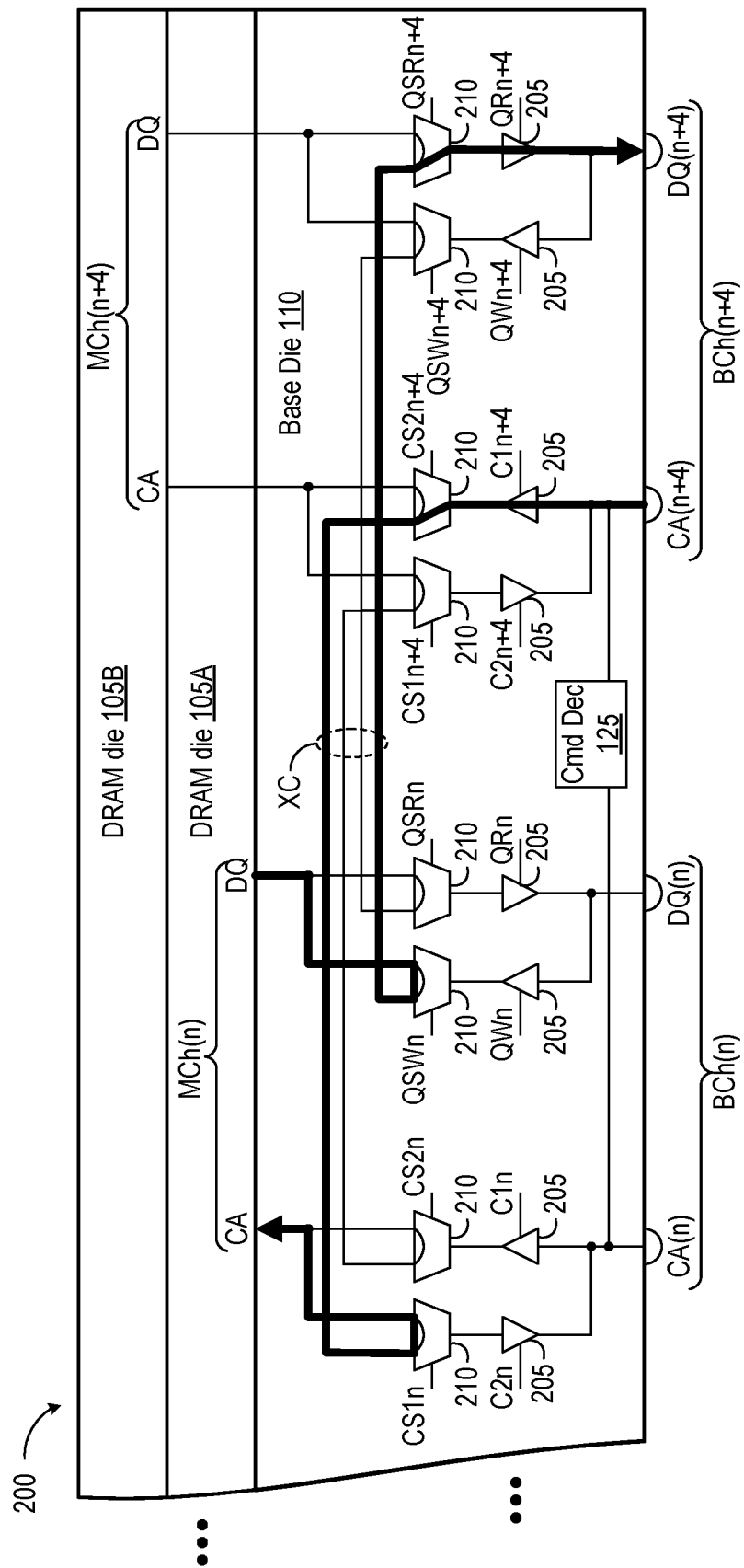
FIG. 2D depicts the signal paths of memory device 200 for command/address signals CA(n+4) and data signals DQ(n+4) on channel BCh(n+4) when reading data DQ from DRAM die 105A via memory channel MCh(n).
Figure 2E:
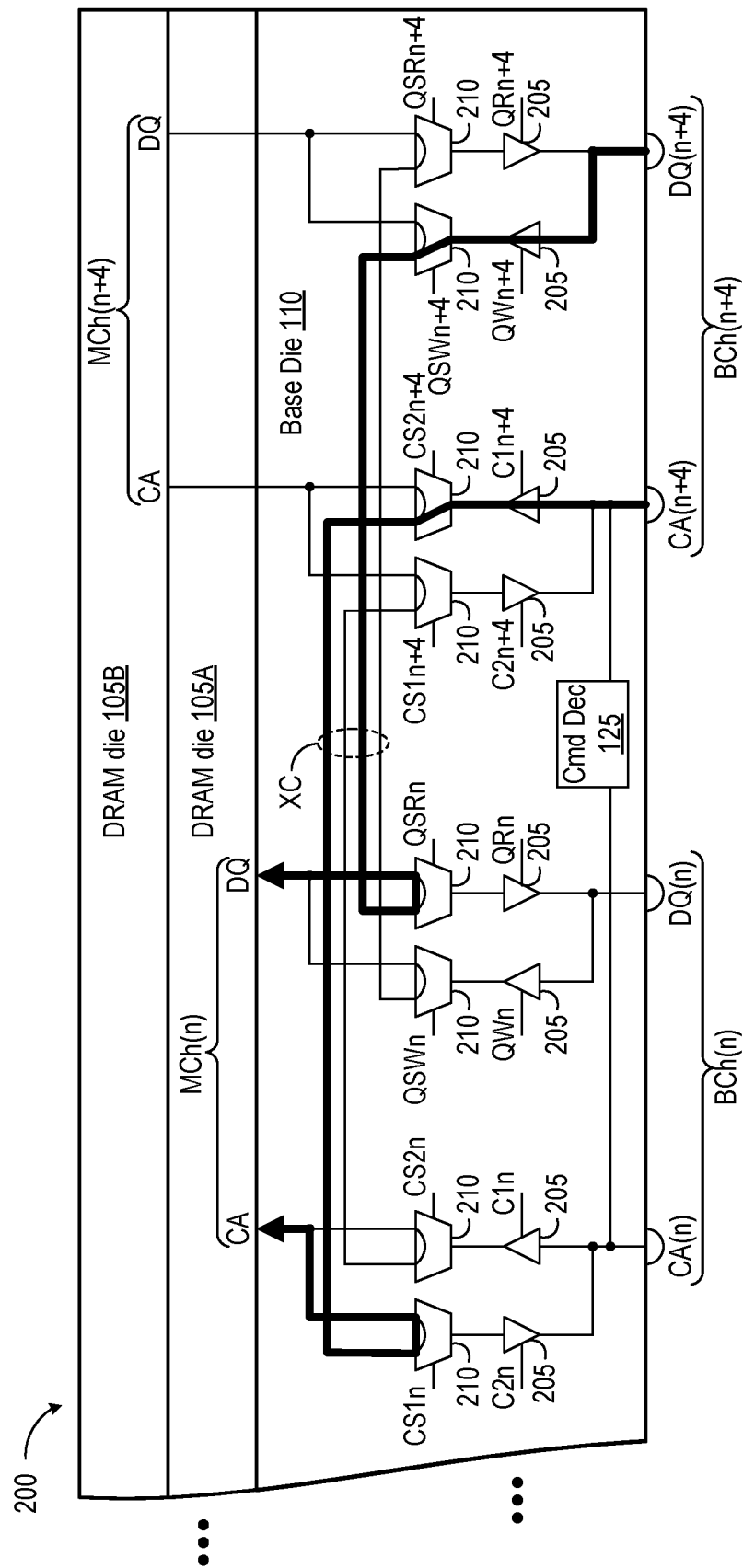
FIG. 2E depicts the signal paths of memory device 200 for command/address signals CA(n+4) and data signals DQ(n+4) on channel BCh(n+4) when writing data DQ to DRAM die 105A via memory channel MCh(n).

FIG. 2D depicts the signal paths of memory device 200 for command/address signals CA(n+4) and data signals DQ(n+4) on channel BCh(n+4) when reading data DQ from DRAM die 105A via memory channel MCh(n). FIG. 2E depicts the signal paths of memory device 200 for command/address signals CA(n+4) and data signals DQ(n+4) on channel BCh(n+4) when writing data DQ to DRAM die 105A via memory channel MCh(n). Though not shown, base die 110 supports the same set of connectivities to allow both external memory channels BCh(n) and BCh(n+4) to access DRAM die 105B via internal memory channel MCh(n+4).

Figure 2F:
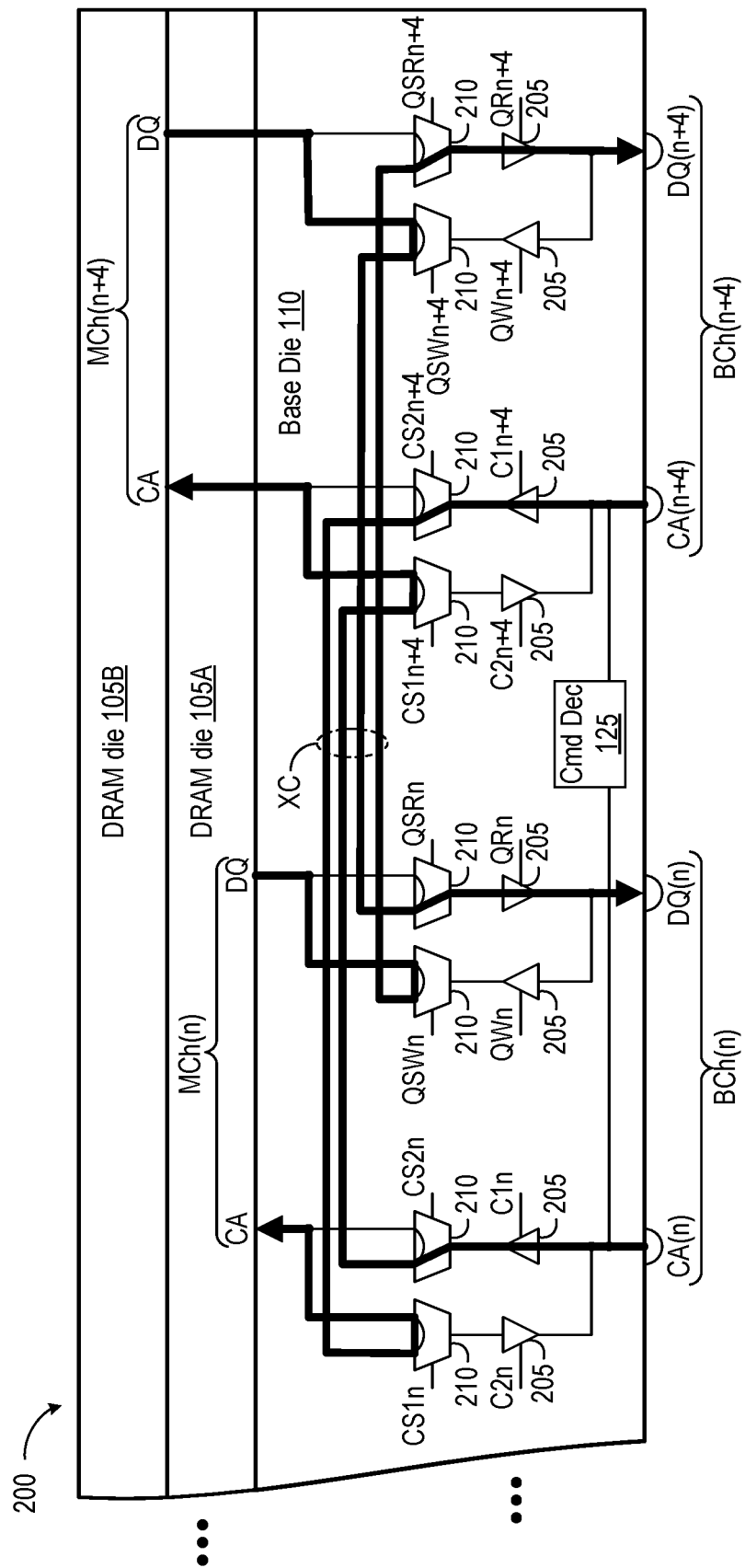
FIG. 2F depicts the signal paths of memory device 200 that allow both external memory channels BCh(n) and BCh(n+4) to have simultaneous or near simultaneous read access to the addressable memories of respective DRAM dies 105B and 105A.
Figure 2G:
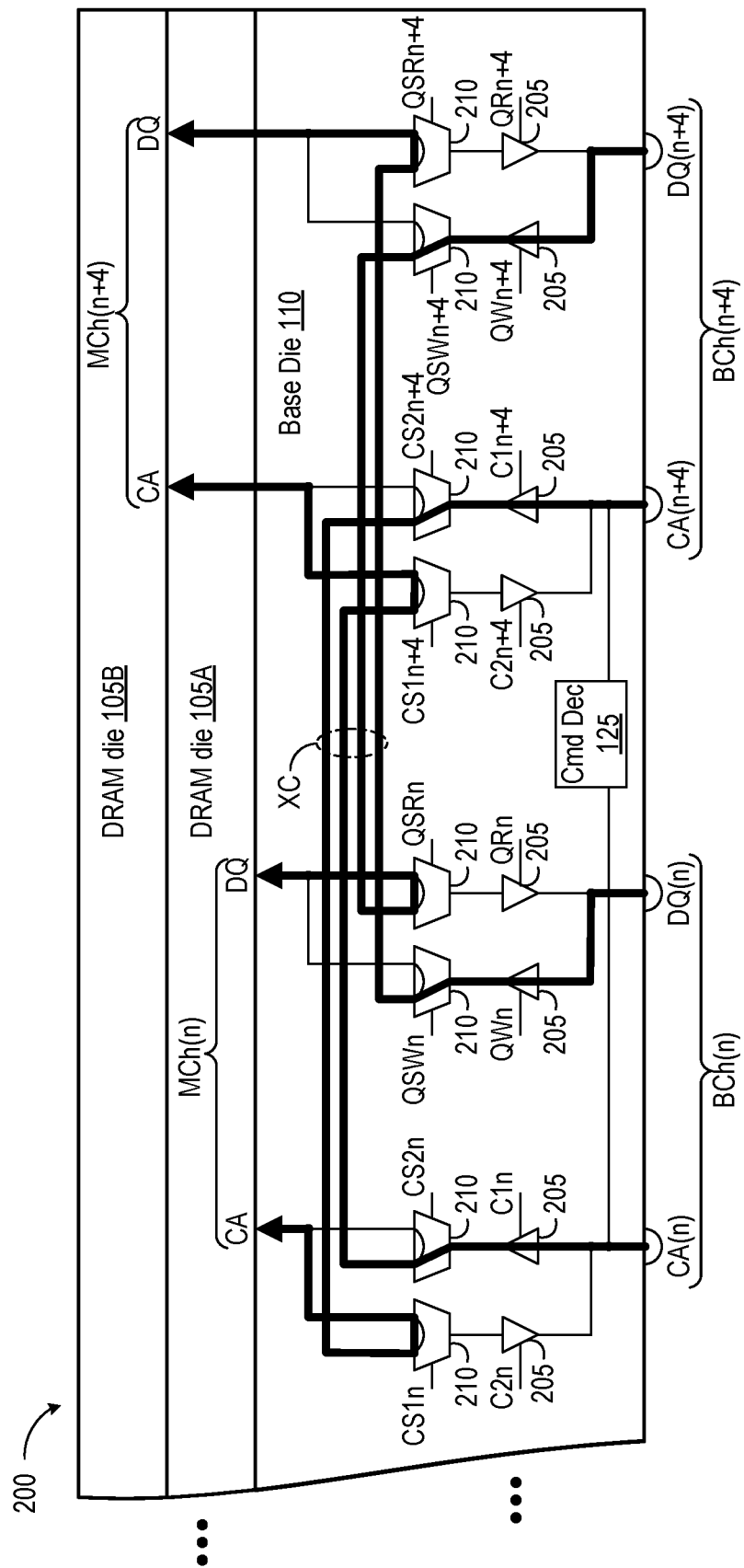
FIG. 2G depicts the signal paths of memory device 200 that allow both external memory channels BCh(n) and BCh(n+4) to have simultaneous or near simultaneous write access to the addressable memories of respective DRAM dies 105B and 105A.

FIG. 2F depicts the signal paths of memory device 200 that allow both external memory channels BCh(n) and BCh(n+4) to have simultaneous or near simultaneous read access to the addressable memories of respective DRAM dies 105B and 105A. FIG. 2G depicts the signal paths of memory device 200 that allow both external memory channels BCh(n) and BCh(n+4) to have simultaneous or near simultaneous write access to the addressable memories of respective DRAM dies 105B and 105A.

Figure 2H:
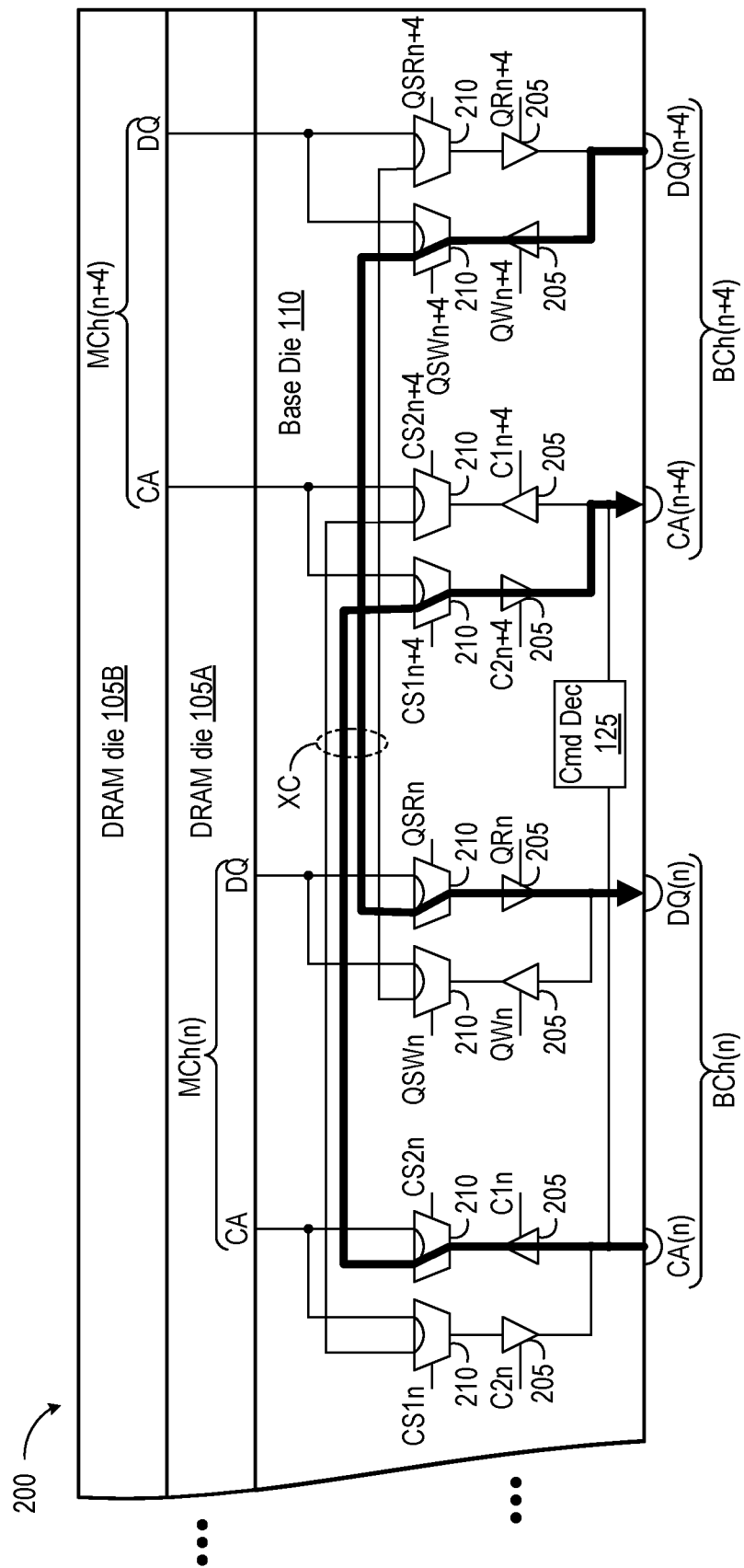
FIG. 2H shows memory device 200 with base die 100 in a bypass state in which external command/address signals CA(n) on external channel BCh(n) are conveyed from base die 110 via connections CA(n+4) to request read data from another memory resource (not shown).
Figure 2I:
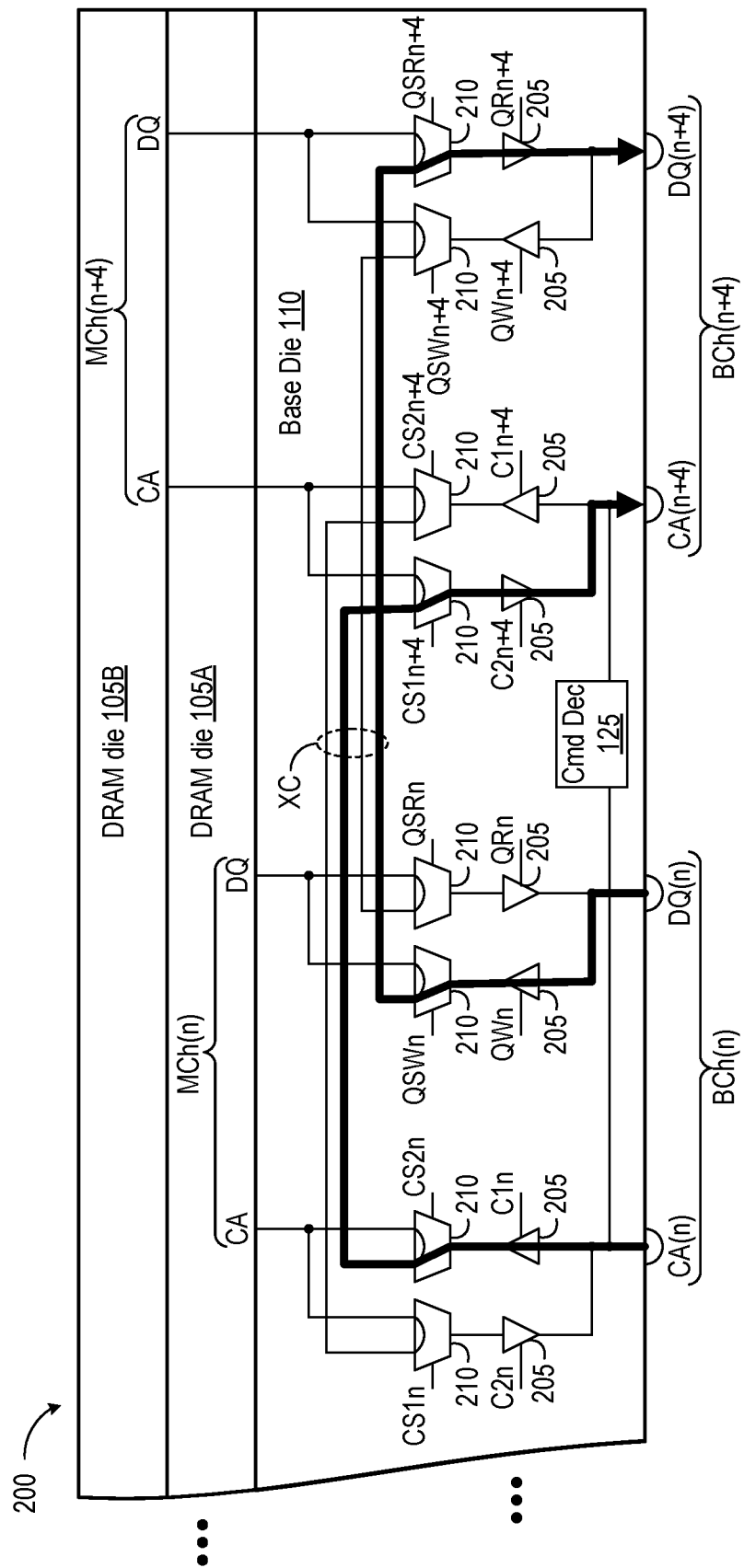
FIG. 2I shows memory device 200 with base die 100 in a bypass state in which external command/address signals CA(n) on external channel BCh(n) are conveyed from base die 110 via connections CA(n+4) to request data signals DQ(n) be written to another memory resource.

FIG. 2H shows memory device 200 with base die 100 in a bypass state in which external command/address signals CA(n) on external channel BCh(n) are conveyed from base die 110 via connections CA(n+4) to request read data from another memory resource (not shown). Base die 110 directs the read data received responsive to the command from external data connections DQ(n+4) to external data connections DQ(n). Memory device 200 thus services the read command, from the perspective of a requesting host, without reference to DRAM dies 105A and 105B. FIG. 2I shows memory device 200 with base die 100 in a bypass state in which external command/address signals CA(n) on external channel BCh(n) are conveyed from base die 110 via connections CA(n+4) to request data signals DQ(n) be written to another memory resource (not shown). Base die 110 directs the write data received on connections DQ(n) in association with the command from base die 110 via external data connections DQ(n+4). Memory device 200 thus services the write command without reference to DRAM dies 105A and 105B. Though not shown, base die 110 supports the same set of connectivities to allow external channel BCh(n+4) to access another memory resource via channel BCh(n). Access bandwidth is halved in the bypass state because half of the external channels BCh[8:1] are used for input and the other half for output.

FIG. 3A depicts a memory system 300 in which a processing unit 305 with eight sets of memory interfaces is connected to four, two-channel stacked memory devices 310. Each memory device 310 can be a 3D-IC of the type described previously as memory device 100 of FIG. 1. Like that embodiment, each memory device 310 includes eight external channels BCh[8:1] and eight internal channels MCh[8:1]. System 300 can be thought of as a "default" setting in which memory devices 310 operate as unmodified HBM memory in support of a legacy mode.

Processing unit 305 can be or include a graphics-processing unit (GPU), a tensor-processing unit (TPU), or any other form of processor or processors that benefits from access to high-performance memory. Processor 305 and each memory device 310 communicate, in one embodiment, using a High Bandwidth Memory (HBM) interface of a type detailed in the JEDEC Solid State Technology Association standard JESD235B (the "HBM interface"). The HBM interface is a relatively wide, short, point-to-point interface that is divided into independent channels. Each HBM channel includes a 128-bit data bus operating at double data rate (DDR).

Processing unit 305 includes four sets of eight channels, each set divided into two four-channel sets connected to one memory device 310. Set A, for example, includes sets A[4:1] and A[8:5] connected to respective external channels BCh [4:1] and B[8:5] of one memory device 310. The remaining sets B, C, and D are likewise connected to respective memory devices. With each channel operating in the manner illustrated in FIGS. 2B and 2C, processing unit 305 can access memory channels MCh[8:1] in each memory device 310 via respective external channels BCh[8:1].

FIG. 3B depicts a memory system 315 like system 300 of FIG. 3A but extended to include four additional memory devices 310 for double the capacity without additional latency. The memory bandwidth at processing unit 305 is unchanged. Power usage is primarily a function of that bandwidth, so the extension of memory resources has little effect on power except for power components proportional to capacity, e.g. refresh or leakage current. Each set of four channels from processing unit 305 services only one of eight memory devices 310. For example, set A[4:1] communicates with external channels BCh[4:1] of one device 310 and set A[8:5] with external channels B[8:5] of another. As illustrated in FIGS. 2B-2E, each internal channel MCh(n) can be accessed via either external channel BCh(n) or BCh(n+1). Each external channel MCh(n+1) can likewise be accessed via either external channel. Processing unit 305 can thus access all eight internal memory channels MCh[8:1] using either set of external memory channels BCh[4:1] or BCh[8: 5]. This doubling of memory resources does not require the bidirectional command interfaces illustrated above in connection with FIGS. 2A-2I. Processing unit 305 is assigned a larger address space but requires little or no modification to support this doubling. Address space can be extended by e.g. adding address bits to standard memory commands or enabling a connection topology with mode-register commands, the latter not requiring additional address bits.

Figure 3C:
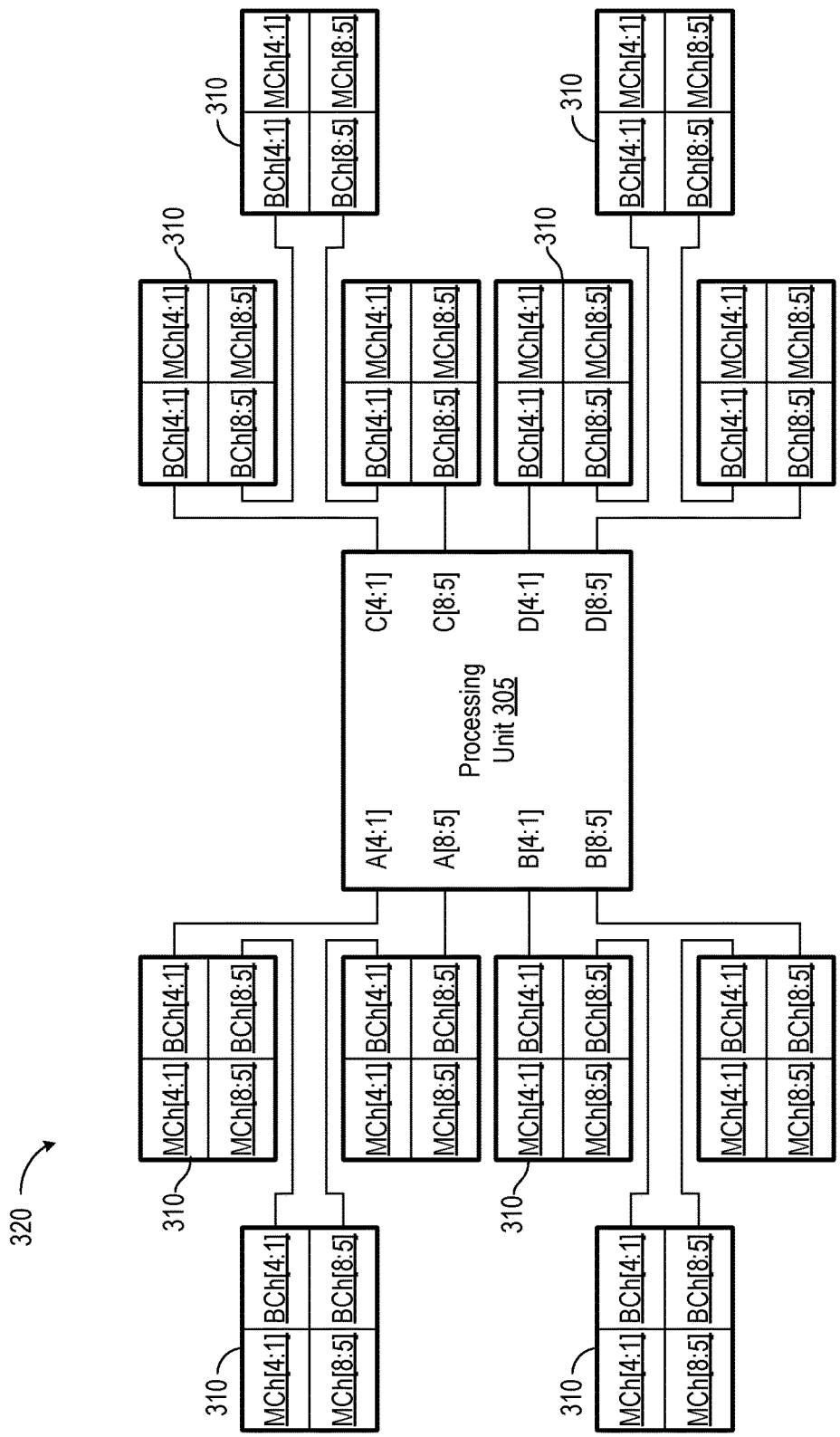
FIG. 3C depicts a memory system 320 like system 300 of FIG. 3A but extended to include eight additional memory devices 310 for triple the capacity.

FIG. 3C depicts a memory system 320 like system 300 of FIG. 3A but extended to include eight additional memory devices 310 for triple the capacity. Each set of four channels from processing unit 305 is connected to one of eight memory device 310. Each of these memory devices relays command/address and data signals to half of the external channels of another memory device 310. For example, set A[4:1] communicates with external channels BCh[4:1] of one device 310. The other external memory channels BCh [8:5] of that memory device 310 are connected to external channels BCh[4:1] of another device 310. Processing unit 305 has access to all memory channels MCh[8:1] in the device 310 that is directly connected to processor channel A[4:1] in the manner of system 315 of FIG. 3B. The cross-channel bypass functionality detailed in connection with FIGS. 2H and 2I allow processing unit 305 to also access a second memory device 310 via processor channel A[4:1] and paired sets of external channels BCh[4:1] and BCh[8:5]. The inclusion of a relay path through one of memory devices 310 increases latency but retains bandwidth. System 320 can be extended to include still more memory devices 310.

Figure 4A:
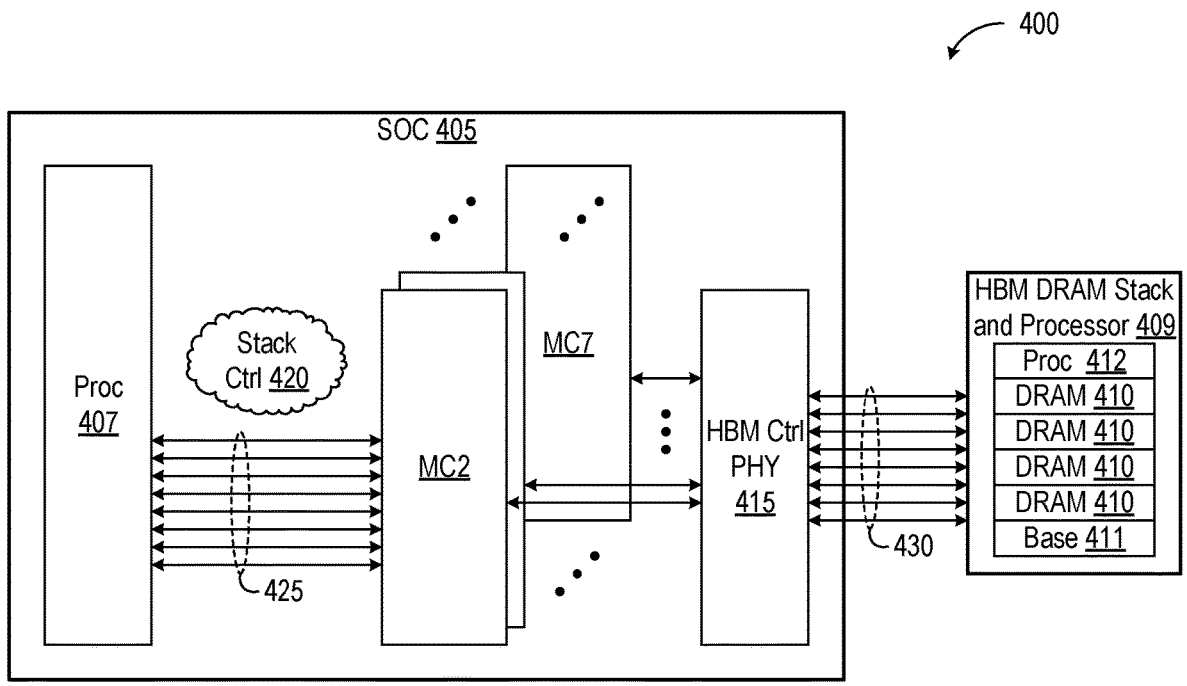
FIG. 4A depicts a computer system 400 in which a system-on-a-chip (SOC) 405 with host processor 407 has access to a device 409 with DRAM dies 410 and a base die 411 of the type detailed previously but modified to include vertical connections (not shown) to a local, integrated processor die 412.

FIG. 4A depicts a computer system 400 in which a system-on-a-chip (SOC) 405 with host processor 407 has access to a device 409 with DRAM dies 410 and a base die 411 of the type detailed previously but modified to include vertical connections (not shown) to a local, integrated processor die 412 with access to the memory in dies 410. Processor die 412 can be e.g. a graphics processor, neural-network accelerator, or cryptocurrency-mining accelerator. Processor die 412 is opposite base die 411 in this example but can be elsewhere in the stack.

Assuming that base die 411 supports eight HBM channels, processor 407 is provided with eight memory controllers MC[7:0], one for each HBM channel. SOC 405 also includes a physical layer (PHY) 415 to interface with device 409. SOC 405 additionally includes or supports, via hardware, software or firmware, stack-control logic 420 that manages connectivity selection for device base die 411 of device 409 and other such devices includes to extend the capacity of system 400 e.g. in the manner detailed previously in connection with FIGS. 3A-3C.

Processor 407 supports eight independent read/write channels 425, one for each external memory controller MC[7:0], that communicate data, address, control, and timing signals as needed. In this context, "external" is with reference to device 409 and is used to distinguish controllers (e.g. sequencers) that may be integrated with (internal to) device 409. Memory controllers MC[7:0] and their respective portions of PHY 415 support eight HBM channels 430—two channels per DRAM die 410—communicating data, address, control, and timing signals that comply with HBM specifications relevant to HBM DRAM dies 410 in this example.

Figure 4B:
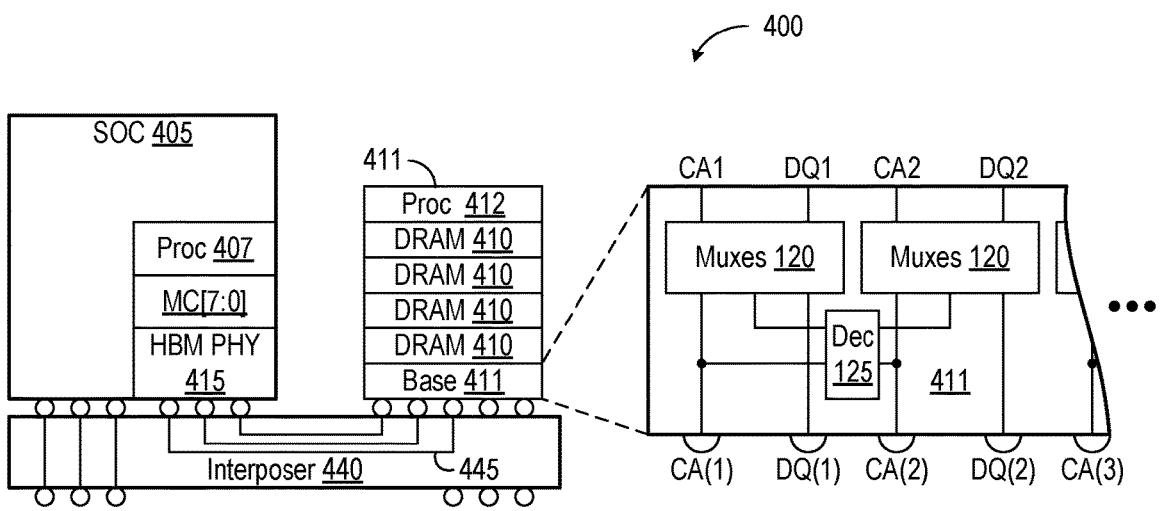
FIG. 4B depicts system 400 in an embodiment in which SOC 405 communicates with device 409 via an interposer 440 with finely spaced traces 445 etched in silicon.

FIG. 4B depicts system 400 in an embodiment in which SOC 405 communicates with device 409 via an interposer 440 with finely spaced traces 445 etched in silicon. The HBM DRAM supports high data bandwidth with a wide interface. In one embodiment, HBM channels 430 include 1,024 data "wires" and hundreds more for command and address signals. Interposer 440 is employed because standard printed-circuit boards (PCBs) cannot manage the requisite connection density. Interposer 440 can be extended to include additional circuitry and can be mounted on some other form of substrate for interconnections to e.g. power-supply lines and additional instances of device 409.

FIG. 5A depicts a memory system 500 in which eight memory devices 310 are interconnected with a processing unit 505 in a ring configuration supported by the connectivity detailed in connection with FIGS. 2A-2I. FIG. 5B depicts a memory system 505 like that of FIG. 5A but in which each memory device 310 is fitted with a processor die 412 as discussed in connection with FIGS. 4A and 4B. Processor die 412 is a neural-network accelerator, in this example, on top of the DRAM stack opposite to the base die. Processor dies 412 each have the capability to issue accesses the memory, so the movement of data and control signals through and between devices 310 can be directed independent of processing unit 505.

While the foregoing discussion relates to DRAM, other types of memory can benefit from the above-described interfaces. Moreover, channel and cross-channel groupings need not be in groups of two: divisions could be finer and more complex connection geometries could be used. More or fewer memory dies can also be used. Variations of these embodiments will be apparent to those of ordinary skill in the art upon reviewing this disclosure. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under 35 U.S.C. § 112(f).

What is claimed is:

1. A base die comprising:
   first intra-stack command and data connections to connect to a first addressable memory;
   second intra-stack command and data connections to connect to second addressable memory;
   a first external channel with first external command and data connections;
   a second external channel with second external command and data connections; and
   a command and data interface to selectively connect the first external command and data connections to the first intra-stack command and data connections responsive to a first address signal and to the second intra-stack command and data connections responsive to a second address signal.

2. The base of claim 1, the command and data interface to selectively interconnect the first external command and data connections with the second external command and data connections.

3. The base of claim 1, wherein the command and data interface includes a bidirectional command link between the command connections of the first external command and data connections with the command connections of the second external command and data connections.

4. The base of claim 1, the base die further comprising a command decoder coupled to the first external channel to decode commands and direct data received on the first external command and data connections.

5. The base of claim 4, wherein the command decoder is coupled to the second external channel to decode commands and direct data received on the second command and data connections.

6. The base of claim 4, wherein the command decoder decodes one of the commands on the first external channel to direct the data received on the first external command and data connections to the second command and data connections.

7. The base of claim 4, further comprising a mode register coupled to the command decoder, the mode register to store a mode value responsive to the commands, the mode value defining connectivity between one of the first and second external command and data connections and one of the first and second intra-stack command and data connections.

8. The base die of claim 1, the first and second intra-stack command and data connections comprising through-silicon vias.

9. A die stack having:
a first memory die having first addressable memory;
a second memory die having second addressable memory; and
a base die stacked with the first memory die and the second memory die, the base die having:
a first external channel with first command and data connections;
a second external channel with second command and data connections;
a first internal channel coupled to the first addressable memory;
a second internal channel coupled to the second addressable memory; and
a memory interface to selectively connect the first external channel to the first internal channel responsive to a first address signal and to the second internal channel responsive to a second address signal.

10. The die stack of claim 9, the memory interface to selectively interconnect the first external channel to the second external channel.

11. The die stack of claim 9, wherein the memory interface includes a bidirectional command interface and a bidirectional data interface.

12. The die stack of claim 9, wherein the memory interface includes a bidirectional data interface.

13. The die stack of claim 9, the base die further comprising a command decoder coupled to the first external channel to decode commands received via the first external channel.

14. The die stack of claim 13, wherein the command decoder is coupled to the second external channel to decode second commands received via the second external channel.

15. The die stack of claim 9, further comprising a processing die stacked with the base die, the first memory die, and the second memory die.

16. The die stack of claim 15, wherein the first memory die and the second memory die are between the base die and the processing die.

17. A memory system comprising:
first and second die stacks, each die stack having:
a first memory die having first addressable memory;
a second memory die having second addressable memory; and
a base die stacked with the first memory die and the second memory die, the base die having:
a first external channel with first command and data connections;
a second external channel with second command and data connections;
a first internal channel coupled to the first addressable memory;
a second internal channel coupled to the second addressable memory; and
a memory interface to selectively connect the first external channel to the first internal channel responsive to a first address signal and to the second internal channel responsive to a second address signal; and
a processing unit having a channel connected to the first external channel of the base die of the first die stack;
wherein the second external channel of the base die of the first die stack is connected to one of the first and second external channels of the base die of the second die stack.

18. The memory system of claim 17, further comprising a third die stack having a third external channel connected to the other of the first and second external channels of the base die of the second die stack.

19. The memory system of claim 18, the third die stacking having a fourth external channel connected to the processing unit.

20. The memory system of claim 18, further comprising an interposer connected to the base die.

* * * * *